United States Patent [19]
Tobe et al.

[11] Patent Number: 5,891,349
[45] Date of Patent: *Apr. 6, 1999

[54] PLASMA ENHANCED CVD APPARATUS AND PROCESS, AND DRY ETCHING APPARATUS AND PROCESS

[75] Inventors: Ryoki Tobe; Masao Sasaki; Atsushi Sekiguchi; Ken-ichi Takagi, all of Tokyo, Japan

[73] Assignee: Anelva Corporation, Fuchu, Japan

[ * ] Notice: The term of this patent shall not extend beyond the expiration date of Pat. No. 5,721,021.

[21] Appl. No.: 720,868

[22] Filed: Oct. 3, 1996

[30] Foreign Application Priority Data

Oct. 11, 1995 [JP] Japan .................................. 7-288117

[51] Int. Cl.⁶ .................................................. H05H 1/00
[52] U.S. Cl. .............................. 216/68; 216/71; 156/345; 427/569; 118/723 I; 118/723 E
[58] Field of Search .......................... 156/345; 118/723 I, 118/723 IR, 723 AN, 723 E; 438/729; 216/68, 71; 204/298.34, 298.08; 427/569

[56] References Cited

U.S. PATENT DOCUMENTS

| | | | |
|---|---|---|---|
| 5,531,834 | 7/1996 | Ishizuka et al. | 118/723 I |
| 5,721,021 | 2/1998 | Tobe et al. | 118/723 E |

FOREIGN PATENT DOCUMENTS

| | | |
|---|---|---|
| 5-58072 | 8/1993 | Japan . |
| 6-35663 | 5/1994 | Japan . |
| 6-275600 | 9/1994 | Japan . |
| 7-18433 | 1/1995 | Japan . |
| 7-40468 | 6/1995 | Japan . |
| 7-254500 | 10/1995 | Japan . |

OTHER PUBLICATIONS

Observation of Ion Scattering from Metal Surfaces Bombarded with Low–Energy Hydrocarbon Ions; Jpn. J. Appl. Phys. vol. 34 (1995) pp. L516–L519; Part 2, No. 4B; 15 Apr. 1995.

Electrostatic Coupling of Antenna and the Shielding Effect in Inductive RF Plasma; Jpn. J. Appl. Phys. vol. 33 (1994) pp. 2189–2193; Part 1, No. 4B, Apr. 1994.

8th Symposium on Plasma Science for Materials; Japanese Society for the Promotion of Science, Committee 153 (Plasma Material Science) p. 87; Jun. 1995.

RF Plasma Production at Ultralow Pressures with Surface Magnetic Confinement; Jap. J. of Applied Phys. vol. 29, No. 6, Jun. 1990, pp. L1015–L1018.

*Primary Examiner*—Thi Dang
*Attorney, Agent, or Firm*—Burns, Doane, Swecker & Mathis, LLP

[57] ABSTRACT

A plasma enhanced CVD apparatus includes a processing chamber, a pumping system for evacuating the processing chamber, a gas inlet system for introducing a source gas, and a plasma generating electrode provided in the processing chamber for depositing a film on a substrate in the processing chamber by plasma generated by electrical power supplied to the plasma generating electrode; the plasma generating electrode has two terminals, one of the terminals is connected to a radio frequency power source and other of the terminals is grounded through an electrode potential controlling system; and the processing chamber is grounded through an inner wall potential controlling system. The present invention is further directed to a plasma enhanced CVD process, a dry etching apparatus, and a dry etch process.

36 Claims, 13 Drawing Sheets

PLASMA ENHANCED CVD APPARATUS AND PROCESS, AND DRY ETCHING APPARATUS AND PROCESS

BACKGROUND OF THE INVENTION

1. Field of the Invention

The present invention relates to a plasma enhanced CVD apparatus having a plasma generating electrode in its processing chamber and a process for using it. The present invention further relates to an apparatus for dry etching having a plasma generating electrode in its processing chamber, and a process for using it.

2. Description of the Related Art

Plasma enhanced CVD is a thin film deposition method in which a film is deposited on a substrate by the chemical reaction of source gases using plasma. Plasma enhanced CVD has been widely applied to various thin film deposition processes, e.g., semiconductor IC devices, superconductive devices, various electronic devices, metal films comprising various sensors, semiconductor films, insulation films, photoconductor films, barrier films, and adhesion films. In addition, dry etching is a widely used method for etching such thin films by the chemical reaction of an etching source gas using plasma. In recent years, low-pressure, high-density plasma has attracted the attention of semiconductor engineers in such plasma processing methods. Low-pressure, high-density plasma enables novel processing which has not been realized, and improves processing efficiency.

Prior art will be explained using a plasma enhanced CVD apparatus as an example below. In general, a plasma generating electrode is used to generate plasma in a processing chamber and a radio frequency power is applied to the plasma generating electrode. Plasma generating electrodes are classified as either capacitively coupling types or inductively coupling types, or from a different viewpoint, as external electrode types each having an electrode outside its processing chamber, and internal electrode types each having an electrode inside its processing chamber. Among them, capacitively coupling and internal electrode-type parallel plate plasma enhanced CVD apparatus have been most widely used.

In a parallel plate plasma enhanced CVD apparatus, two electrodes are oppositely provided to each other so as to apply radio frequency power, low frequency power, direct current power, and time-modulated powers thereof to one of them, and to ground the other. Another electrode may be grounded through a capacitor, coil (inductor), or a combination of the capacitor and coil. These parallel plate electrodes are provided to generate and sustain plasma by the interaction caused by collisions between charged particles and between charged particles and the two electrodes after accelerating charged particles by means of an electrostatic field between the two electrodes. The parallel plate plasma enhanced CVD apparatus can hardly generate and sustain plasma under a pressure of 100 mtorr or less. Thus, low-pressure, high-density plasma cannot be generated in such an apparatus.

Inductively coupling types of plasma generating methods have been widely used to generate low-pressure, high-density plasma, as described in, for example, "Novel Development in Low-Pressure, High-Density Plasma" by Hideo Sugai (Applied Physics, Vol. 63, No. 6, pp. 559–567, (1994)). In the inductively coupling-type apparatus, plasma is generated and sustained by the electromagnetic induction caused by current variance of a plasma generating antenna. That is, the plasma is generated and sustained by the interaction between electromagnetic waves and charged particles. Thus, this type can provide low-pressure, high-density plasma since it can generate and sustain plasma even under a pressure of 100 mtorr or less.

In the inductively coupling types, external antenna types have been widely used, wherein a plasma generating antenna is provided outside the processing chamber. In detail, a coil or deformed loop plasma generating antenna is provided around the outside of the discharge chamber, which is made of dielectric materials, to generate the low-pressure, high-density plasma. However, such external antenna types have a drawback. When a film having relatively high conductivity, such as a conductive film or a semiconductive film (hereinafter "conductive film"), is prepared, some of the conductive film is deposited on the inner wall of the dielectric discharge chamber so that electromagnetic waves radiated from the plasma generating antenna provided around the discharge chamber are shielded by the conductive film deposited on the inner wall. Such deposition often causes unstable plasma in the discharge chamber or sometimes causes a failure in plasma generation. Accordingly, the inner wall of the discharge chamber must be frequently cleaned when a conductive film is deposited on a substrate with an external antenna-type plasma generating apparatus.

A method in which an inductively coupling-type antenna is placed inside the processing chamber (hereinafter "internal antenna type") is known as the method compensating for the drawback of the external antenna type, as described in "Hideo Sugai, Kenji Nakamura, Keiji Suzuki: Japanese Journal of Applied Physics Vol. 33(1994) pp. 2189–2193", as well as the above Sugai's article. A sputtering apparatus using such an internal antenna is disclosed in Japanese Laid-Open Patent No. 7-18433.

In the internal antenna-type plasma generating apparatus disclosed in the above article by Sugai et al., an antenna comprising substantially a loop coil of one-turn is provided inside the processing chamber. One terminal of the antenna is connected to a radio frequency power, and the other terminal is grounded. The antenna surface is covered with a dielectric so as to stabilize the plasma. When a conductive film is deposited on a substrate with such a plasma generation apparatus, the following problems will occur. A conductive film deposits on the antenna surface when the conductive film is deposited on the substrate by plasma enhanced CVD. Further, when a metal substrate is etched by dry etching, gaseous metal compounds adhere to the antenna surface and deposit on the antenna surface as a metal film. After the conductive film deposits on the antenna surface covered with a dielectric, the plasma generating state changes with the progress of the substrate processing. Thus, the reproducibility of the substrate processing is lost after a long time batch processing of the substrate. Further, the plasma is unstably generated due to a decreased effect of the dielectric cover. Thus, the antenna surface must be frequently cleaned.

In the plasma generating apparatus disclosed in the aforementioned article by Sugai, a negative direct current bias voltage is induced on the surface of the dielectric cover of the antenna by means of a radio frequency power applied to the antenna. A potential difference between the direct current bias voltage and the plasma potential accelerates positive ions to an extent that the positive ions impinge the dielectric cover on the antenna surface to sputter the dielectric cover. As a result, when such a plasma generating apparatus is used for film deposition, the deposited film may be contaminated with materials from the dielectric cover so it is difficult to deposit a highly pure film.

When the dielectric cover is not provided on the antenna surface in the plasma generating apparatus in Sugai et al., although the above-mentioned problems do not occur, other problems will occur as follows. Since one end of the antenna is grounded so as to pass through a direct current, no direct current bias potential occurs in the antenna, but the antenna potential symmetrically varies between positive and negative with time from the ground potential as the standard due to the radio frequency power applied to the antenna. Charged particles such as electrons and positive ions flow into the antenna due to the variability of the antenna potential with time. Since the mass of electrons is extremely smaller than those of positive ions, electrons have a higher kinetic energy in the electric field. Thus a much greater amount of electrons flows into the antenna than positive ions. On the other hand, since no direct current bias potential occurs in the antenna, the plasma potential necessarily shifts to a positive potential side so that the overall charge of charged particles flowing into the antenna is balanced. The electric field increases between the inner wall of the processing chamber and the plasma, and thus the positive ions are further accelerated toward the inner wall. As a result, a larger amount of secondary electrons are generated by the collision of accelerated positive ions with the processing chamber, and local continuous self-discharge occurs in any place of the inner wall. The inner wall is heated by the continuous discharge, resulting in hot cathode arc discharge. In such an arc discharge mode, a large current flows between the plasma and the inner wall of the processing chamber. Although the space potential in the plasma decreases thereby to temporarily cease the continuous discharge, the space potential in the plasma increases again to cause the continuous discharge between the plasma and the inner wall. In such a way, since the space potential in the plasma periodically and significantly varies, stable plasma cannot be achieved. Further, because the inner wall of the processing chamber is locally overheated by the hot cathode arc discharge, the metal material comprising the processing chamber evaporates to result in the contamination of the processed substrate. When no dielectric cover is provided as described above, the electron density in the plasma is remarkably low compared to the case with a dielectric cover even if the input power is increased. Thus, low-pressure, high-density plasma cannot be achieved by such a method.

In the above sputtering apparatus in Japanese Laid-Open Patent No. 7-18433, a loop antenna of one-turn is provided inside the processing chamber, a terminal of the antenna connects to the radio frequency power and the bias direct current power, and another terminal is grounded through a direct current-blocking capacitor. The antenna itself is used as the target material of the sputtering apparatus. If regarding this apparatus as a plasma generating apparatus and comparing this with the above apparatus by Sugai, there are two differences between them. In the former apparatus no dielectric cover is used for the antenna and one terminal of the antenna is grounded through a capacitor so as not to cause direct current to flow. As a result of such differences, the problems of the apparatus by Sugai are solved in the former apparatus.

However, the present inventors found the following problems when a film is deposited on a substrate by plasma enhanced CVD using the plasma generating apparatus disclosed in Japanese Laid-Open Patent No. 7-18433. That is, in that apparatus, a high bias direct current is applied to the antenna for sputtering the antenna. The film deposition by plasma enhanced CVD using such a high bias direct current causes an excessive sputtering effect. Thus, excellent conformal step coverage of fine contact holes inherent in CVD cannot be achieved. Further, the antenna cannot be used for a long time period due to etching prompted by sputtering. When the direct current bias power and the direct current-blocking capacitor are removed from this apparatus in order to reduce the sputtering effects, other new problems occur, i.e., discharge is unstable and low-pressure, high-density plasma cannot be achieved.

Japanese Unexamined Patent Publication No. 7-254500 discloses a plasma processing device having a plasma generating coil. The position of the plasma generating coil is adjustable. In addition, the surface of the plasma generating coil may be covered with an insulating member, or the plasma generating coil may be formed from a pipe to allow a heating medium to pass therethrough.

SUMMARY OF THE INVENTION

The foregoing drawbacks have been solved by the present invention. It is an object of the present invention to achieve a stable plasma enhanced CVD over a long time period using low-pressure, high-density plasma. It is another object of the present invention to achieve a stable dry etching using the low-pressure, high-density plasma.

The present inventors have intensively studied an apparatus construction for stably generating low-pressure, high-density plasma in a plasma enhanced CVD apparatus in which a plasma generating electrode having two terminals is provided inside a processing chamber. As a result, it has been found that it is important to optimally control the relative potential between the plasma generating electrode and the inner wall of the processing chamber in this type of electrode. Therefore, in the present invention, between two terminals of the plasma generating electrode, one terminal not connected to a radio frequency power source is grounded through an electrode potential controlling system, so as not to pass through a direct current, and the processing chamber is also grounded through an inner wall potential controlling system, so as not to pass through a direct current. Further, in view of controlling the relative potential between the plasma generating electrode and the inner wall of the processing chamber, it is also useful that another terminal of the two terminals, not connected to the radio frequency power source, is grounded through the electrode potential controlling system so as not to pass through a direct current and the processing chamber is grounded. To the contrary, it is also useful that the processing chamber is grounded through the inner wall potential controlling system so as not to pass through a direct current, and one terminal of the plasma generating electrode, not connected to the radio frequency power source, is grounded.

According to the present invention, since stable low-pressure, high-density plasma can be achieved by the construction set forth above, a high quality film is obtainable by a plasma enhanced CVD process. Further, the present invention is satisfactorily applicable to a dry etch process other than the plasma enhanced CVD process.

Since the potential of the inner wall of the processing chamber can be relatively varied to the plasma generating electrode, the relative potential between the plasma generating electrode and the inner wall of the processing chamber can be optimized. For example, when a plasma potential is raised on the basis of the plasma generating electrode potential, the potential difference between the plasma and the inner wall of the processing chamber can be decreased. Thus, the plasma can be stably generated and sustained without abnormal discharge between the plasma and the inner wall of the processing chamber. When a direct current potential difference is optimized between the plasma generating electrode and the plasma, ions are attracted to the plasma generating electrode so that the plasma generating electrode is slightly sputtered. Thus, the plasma generating electrode is cleaned so that stable plasma is generated for a long period time.

In the present invention, capacitors can be used as the electrode potential controlling system and the inner wall potential controlling system, and the potential difference can be controlled between the plasma and the inner wall of the processing chamber by changing the capacitances of the capacitors. A preferable capacitance of the capacitors ranges from 100 pF to 10 $\mu$F. A capacitance smaller than such range may cause unstable discharge, whereas a capacitance larger than such range may require an impractically large size of capacitor when using a ceramic capacitor having excellent radio frequency characteristics.

In addition, when a series circuit consisting of an inductor and a direct current power is used as the electrode potential controlling system and the inner wall potential controlling system, the potential of the plasma generating electrode or of the inner wall of the processing chamber can be more effectively controlled with direct current power.

DESCRIPTION OF THE PREFERRED EMBODIMENTS

Embodiments of this invention will be explained.

Figure 1:
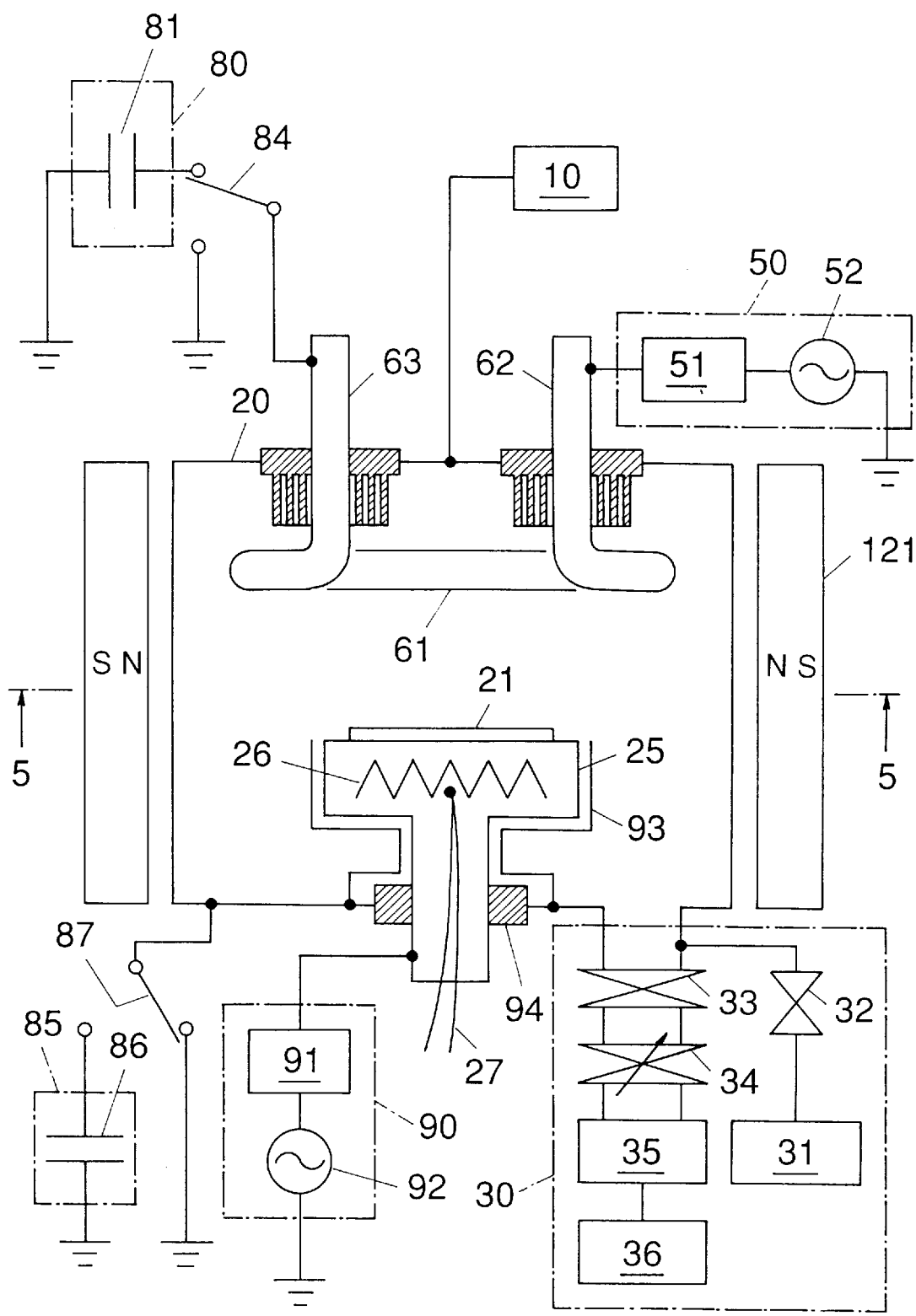
FIG. 1 is a block diagram illustrating an embodiment of a plasma enhanced CVD apparatus in accordance with the present invention.

FIG. 1 is a block diagram illustrating an embodiment of a plasma enhanced CVD apparatus in accordance with the present invention of which the processing chamber is illustrated in a cross-section view. A substrate holder 25 and a plasma generating electrode 61 are provided inside a processing chamber 20 that can be evacuated to vacuum. A bias power supply source 90 is connected to the substrate holder 25. One terminal of the plasma generating electrode 61 is connected to a power supply source 50, and another terminal is selectively connected to an electrode potential controlling system 80 or earth through a switch 84. The processing chamber 20 is connected to a gas inlet system 10 and a gas outlet system 30.

Figure 2:
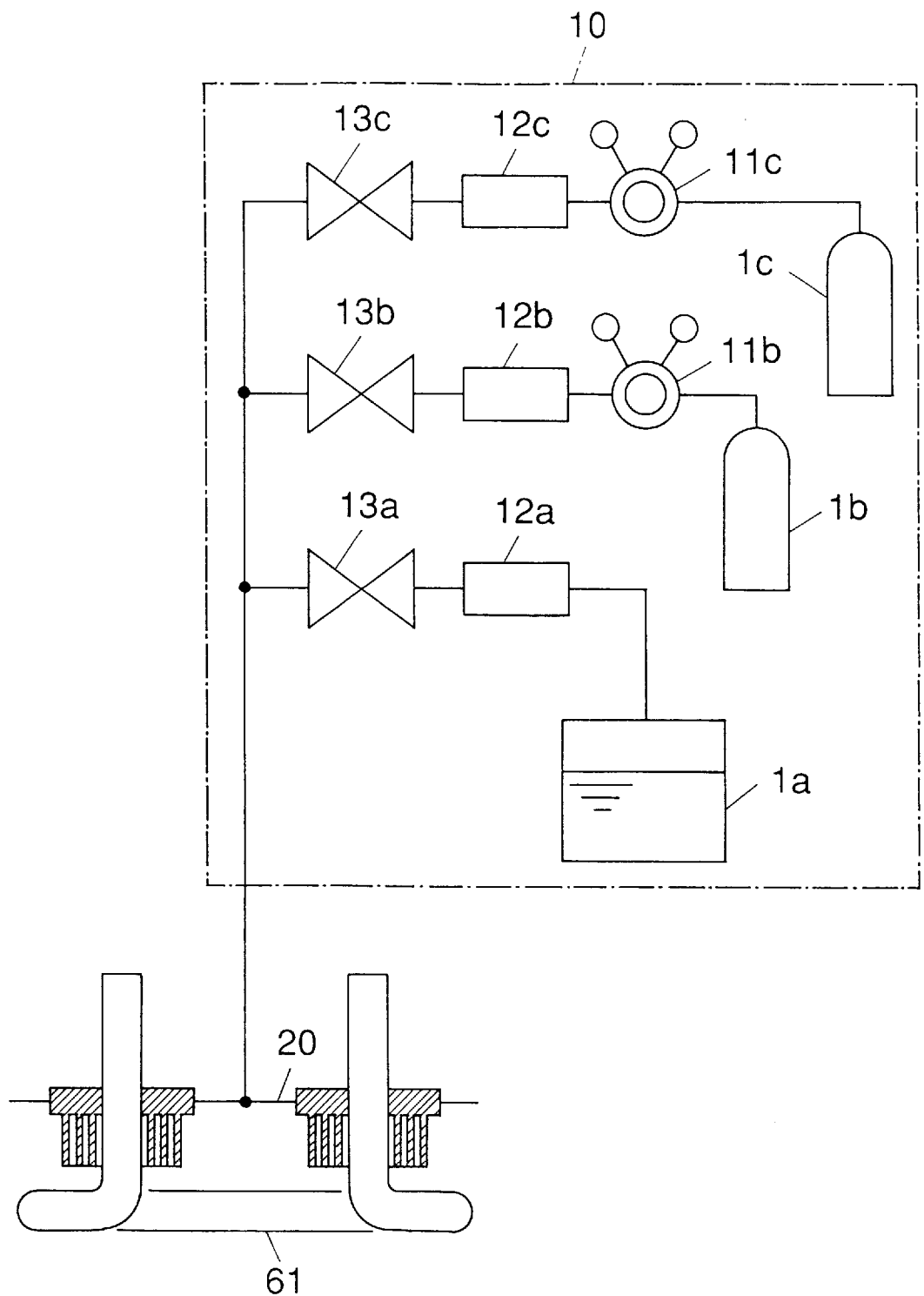
FIG. 2 is a block diagram of the gas inlet system.

The gas inlet system 10 will be explained. FIG. 2 is a block diagram of the gas inlet system 10, in which three kinds of source gas can be used. A source material container 1a acts as a thermostat in which a liquid material at normal temperatures and pressures is heated to evaporate to a given temperature. The evaporated source material is introduced to the processing chamber 20 through a flow controller 12a and valve 13a. Source gases stocked in high pressure cylinders 1b and 1c are reduced to given pressures through pressure reducing valves 13b and 13c, controlled to given flow rates through flow controllers 12b and 12c, and are introduced to the processing chamber 20 through opened valves 13b and 13c, respectively. The injection port of the gas inlet system 10 is placed near the center of the plasma generating electrode 61. Valves 13a, 13b and 13c are opened when source gases are introduced, whereas they are closed to prevent the contamination of the source gases by atmosphere when the processing chamber 20 is released to the atmosphere.

The structure of the substrate holder 25 will be explained in accordance with FIG. 1. A substrate 21 is placed on the substrate holder 25 which is provided with a heater 26 and a thermocouple 27 to control the temperature of the inside of the substrate holder through a substrate thermoregulator that is not shown in the figure. Although a PID control system is used as the substrate thermoregulator in the present invention, any other control systems, e.g., fuzzy circuits, PT controls, and on-off controls, may be employed if necessary.

Then, the gas outlet system 30 will be explained. In the present embodiment, a roughing vacuum pump 31, i.e., oil-sealed mechanical pump having a pumping speed of 650 liter/min., is connected to the processing chamber 20 through a roughing valve 32. When a high degree of cleanliness of the processing chamber 20 is required, an oil-free pump may preferably be used as the roughing vacuum pump 31. Further, when maintenance free operation is required, a dry pump may be used instead. A main pump 35, provided with an auxiliary pump 36, is connected to the processing chamber 20 through a variable orifice 34 and main valve 35. Although for the main pump 35 a combined turbo molecular pump having a pumping speed of 1,300 liter/min. is used in the present embodiment, an oil diffusion pump can be substituted when the cleanliness of the processing chamber 20 is not a requirement. As the auxiliary pump 36 in the present embodiment, an oil-sealed mechanical pump having a pumping speed of 1,180 liter/min. is used, but a dry pump can be substituted similar to the roughing vacuum pump 31.

When evacuating the processing chamber 20, the roughing valve 32 is opened first to evacuate the processing chamber 20 with the roughing vacuum pump 31. After the processing chamber 20 is evacuated to a given pressure (around 100 Pa in the present invention), the roughing valve 32 is closed and the main valve 33 is opened to continue the evacuation to a lower pressure with the main pump 35. The pressure in the processing chamber 20 is effectively regulated within a given range by adjusting the degree of the opening of the variable orifice 34 while monitoring the pressure in the processing chamber using a vacuum gauge.

The variable orifice 34 is effective to achieve reproducible and stable plasma.

A mechanism for applying a bias power to the substrate will be explained. The substrate holder 25 is connected to a bias radio frequency power 92 through an impedance matching circuit 91. The impedance matching circuit 91 and bias radio frequency power 92 comprise a bias power source 90. Alternating power induced by the bias radio frequency power 92 is impedance-matched with the impedance matching circuit 91, and is supplied to the substrate holder 25 to adjust the bias voltage of the substrate 21. The substrate holder 25 is surrounded with a shielding plate 93 that is connected to the processing chamber 20. The substrate holder 25 is electrically insulated from the processing chamber 20 by an insulator 94. The difference of the frequencies between the bias radio frequency power 92 and a plasma generating radio frequency power 52 must be at least 500 Hz, to prevent interference between both radio frequencies and thus to achieve stable plasma. In the present embodiment, the frequencies of the plasma generating radio frequency power 52 and bias radio frequency power 92 are set at 13.560 MHz and 13.562 MHz, respectively.

Figure 5:
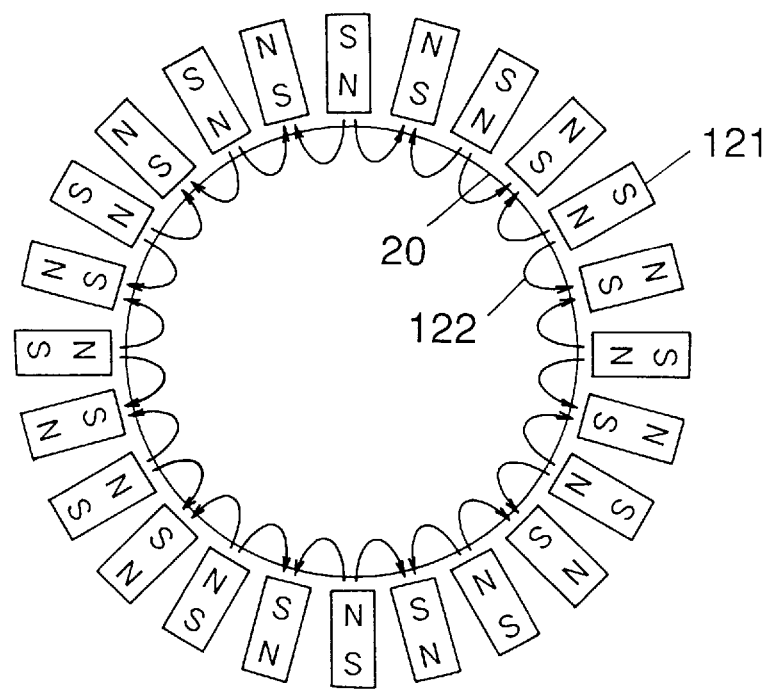
FIG. 5 is a cross-sectional view along 5—5 line of FIG. 1.

A magnetic field generating system will be explained. Twenty four slender permanent magnets 121 are vertically placed at the outer perimeter of the processing chamber 20. FIG. 5 is a cross-sectional view along line 5 . 5 of FIG. 1, and which illustrates a horizontal section of the processing chamber 20. The twenty-four permanent magnets 121 are placed at the perimeter of the processing chamber 20 at regular intervals. Adjacent permanent magnets 121 have polarities opposite to each other, in other words, N-poles and S-poles are alternately placed toward the inside of the processing chamber. By the effects of such permanent magnets 121, a multi-cusp magnetic field 122 is formed. The shape and number of the permanent magnets are not limited to the present embodiment, and any other structure may be employed as long as N-poles and S-poles are alternately placed toward the inside of the processing chamber 20.

In the present embodiment, the permanent magnets 121 are composed of lanthanum-based rare earth magnets each having a size of 25.4 by 6.3 by 12.8 mm. The magnetic flux density at the surface of this magnet is 1,600 gauss. In the present invention, magnets having a magnetic flux density of approximately 400 to 2,200 gauss are preferred. When the magnetic flux density is smaller than the above lower limit, the plasma confinement effect may decrease, so the uniformity in the surface processing may decrease at the periphery of the substrate. On the other hand, an excessive magnetic flux density may cause the isolation of the plasma from the inner wall of the processing chamber, so a homogeneous plasma region may become too small compared with the inner wall of the processing chamber. The interval of the magnetic poles is preferably 150 mm or less. A larger interval may cause a smaller magnetic flux density at the center between the magnetic poles, possibly resulting in a decreased plasma confinement effect. In the present embodiment, the interval of the magnetic poles is 24 mm.

By using such a multi-cusp magnetic field 122, homogeneous high-density plasma can be achieved without plasma diffusion near the inner wall of the processing chamber by means of the plasma confinement effect. By combining such a multi-cusp magnetic field with the bias power source, ions having a high speed can homogeneously flow into the surface of the large substrate.

Figure 3:
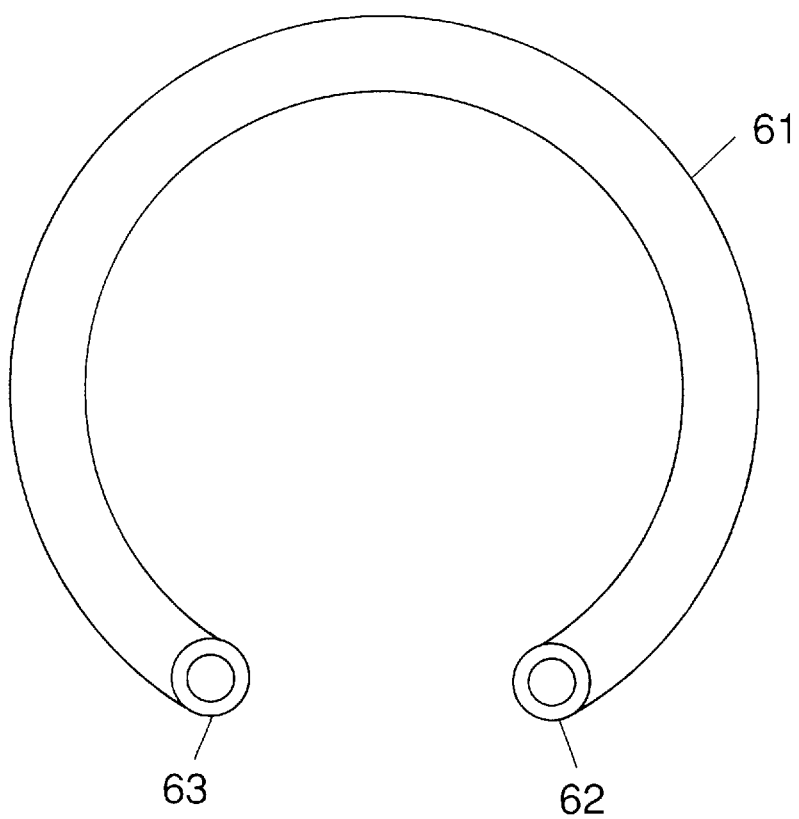
FIG. 3 is a plan view of the plasma generating electrode 61.

The plasma generating apparatus will now be explained. The plasma generating apparatus for generating plasma inside the processing chamber 20 is provided with the power supply source 50, the plasma generating electrode 61 and the electrode potential controlling system 80, as shown in FIG. 1. The plasma generating electrode 61 is substantially a coil of one-turn provided with a pair of lead-in terminals 62 and 63 passing through the wall of the processing chamber 20. The plasma generating electrode 61 is opposite the substrate 21. FIG. 3 is a plan view of the plasma generating electrode 61. The plasma generating electrode 61 is comprised of approximately a round of cylindrical metal pipe having a diameter of approximately 140 mm. The lead-in terminals 62 and 63 are vertically formed to the cylindrical portion. Since the metal pipe is exposed in the processing chamber, the surface of the plasma generating electrode 61 is a conductor. The electrode 61 can be cooled, if necessary, by circulating cooling water or air into the pipe.

Then, the cooling system of the plasma generating electrode will be explained. In the present embodiment, cooling water can be circulated into the hollow metal pipe comprising the lead-in terminals 62 and 63 and the plasma generating electrode 61. The lead-in terminals 62, 63 connect to the inlet and outlet tubes and are made of a fluorine resin. Water is supplied to the inlet tube at a pressure of around 5 kg/cm$^2$, and is drained through the outlet tube at near atmospheric pressure. Cooling water of approximately 15° C. at the inlet port flows inside the plasma generating electrode 61 at a flow rate of 3 liter/min. Water is the most preferable cooling medium in view of large specific heat, ready availability, low viscosity, and the like. Any other cooling medium is also usable. When using air and gaseous nitrogen, it is preferable that the flow rate increases. Cooling with gaseous nitrogen not containing humidity is preferable for preventing electrode corrosion due to humidity.

Since the plasma generating electrode directly contacts plasma, its surface may be etched by the plasma. It is confirmed through experiments that etching can be reduced by cooling the plasma generating electrode with water and thus the plasma generating electrode can be used for a long period. It is presumed that the diameter of the plasma generating electrode decreases by 0.1 mm/hour when not circulating cooling water, and only 0.01 mm/hour when circulating cooling water. Etching of the plasma generating electrodes may cause contamination of the film deposited on the substrate. The contamination can be reduced by cooling with water.

Figure 4:
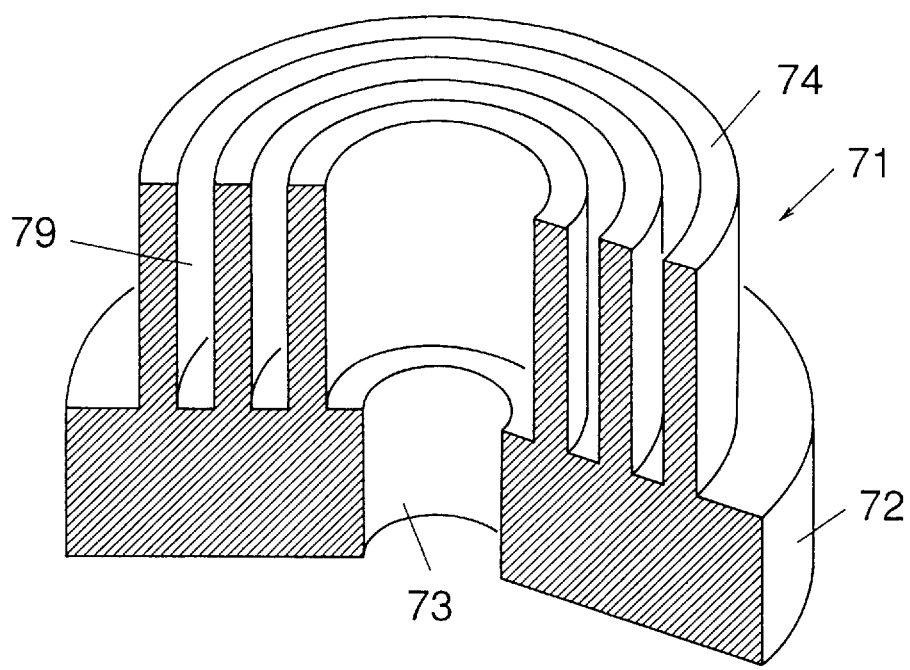
FIG. 4 is an isometric partially broken away view of an insulation ring.

FIG. 4 is an isometric partially broken away view of an insulation ring provided between the lead-in terminals 62, 63 and the processing chamber 20. The insulation ring 71 is preferably comprised of silica glass as an electrical insulator. The insulation ring 71 is sealed to the lead-in terminals 62 and 63 of the plasma generating electrode and to the processing chamber 20 so as to maintain a vacuum. The insulation ring 71 has a through hole in the center of a disk 72, and three annular protrusions 74 are concentrically provided at one side of the disk 72, exposed inside the processing chamber 20. Thus, two annular grooves 79 are formed between these annular protrusions 74. Openings of the grooves 79 are in a plane perpendicular to the shaft line of the through hole 73, while the grooves 79 are parallel to the shaft line of the through hole 73. All the protrusions 74 and grooves 79 are concentric with the through hole 73. The cylindrical lead-in terminal 62 (refer to FIG. 1) of the plasma generating electrode is inserted into the through hole 73. The three annular protrusions 74 are 50-mm high and 1-mm thick. Thus, the grooves 79 have a depth of 50 mm. The width of grooves 79 or distance between adjacent protrusions 74 is 1 mm. All of the surfaces of the annular protrusions 74 and the surface of the disk 72 that are exposed inside the processing chamber 20 (the upper side in FIG. 4) may be roughened by blasting. The roughened surfaces minimizes the peeling off of film adhering to the insulation ring 71. Thus, contamination in the processing chamber due to the peeling off of the film can be prevented or reduced. In detail, the film may adhere to all the sections of the insulation ring 71 other than the grooves 79, for example, the top of the protrusions 74, the outer surface of the outer protrusion, and the disk surface outside the outer protrusion. By roughening the surface of these sections, the adhered film hardly peels off.

In FIG. 1, the lead-in terminal 62 of the plasma generating electrode 61 is connected to the radio frequency power 52 through the impedance matching circuit 51. The power supply source 50 consists of the impedance matching circuit 51 and the radio frequency power 52. The radio frequency power 52 has a frequency of 13.56 MHz and a rated output of 3 kW. Other frequencies are also usable. The most preferable frequency ranges are from approximately 10 kHz to 1,000 MHz. When using a frequency exceeding the above range, the conductor may not be used as a wiring material. On the other hand, a frequency of less than the lower limit may not transmit radio waves. The output waveform may be sinusoidal or deformed sinusoidal waves. In the impedance matching circuit 51, although a Π-type circuit is used in the present embodiment, other circuits, e.g., a T-type circuit, may be used. Alternating power induced by the radio frequency power 52 is supplied to the plasma generating electrode 61 after impedance-matching with the impedance matching circuit 51.

Figure 11A:
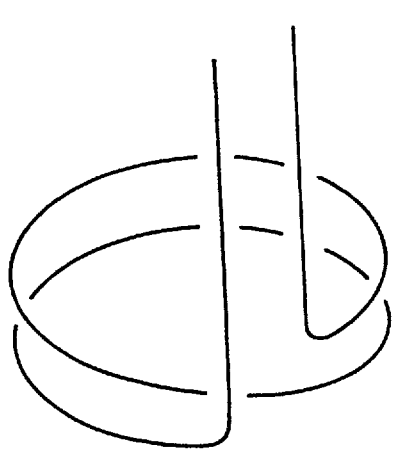
FIGS. 11(A)–(D) are isometric views illustrating other embodiments of the plasma generating electrode.
Figure 11B:
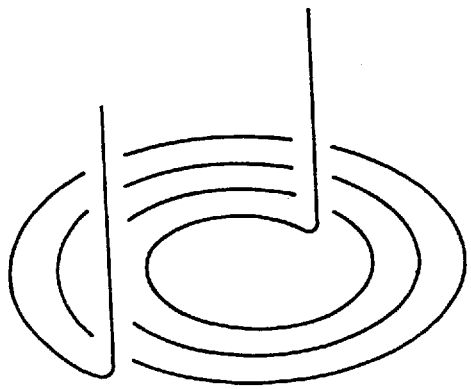
Figure 11C:
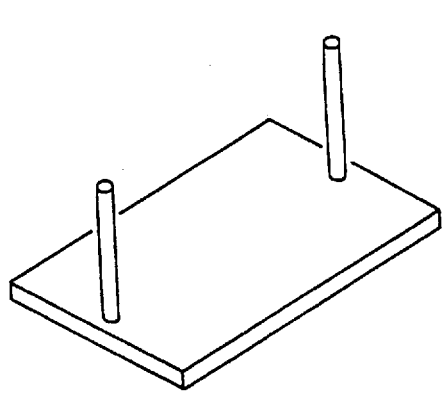
Figure 11D:
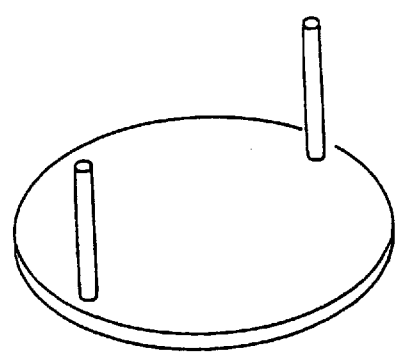
Figure 12A:
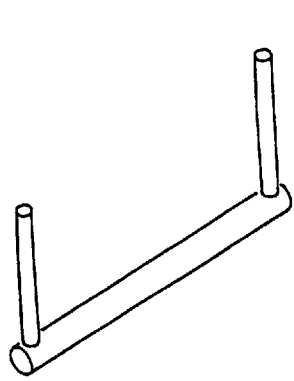
FIGS. 12(A)–(C) are isometric views illustrating further embodiments of the plasma generating electrode.
Figure 12B:
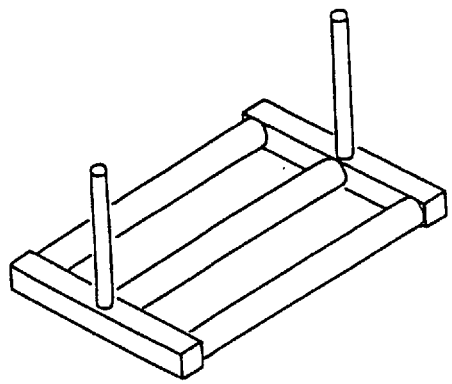
Figure 12C:
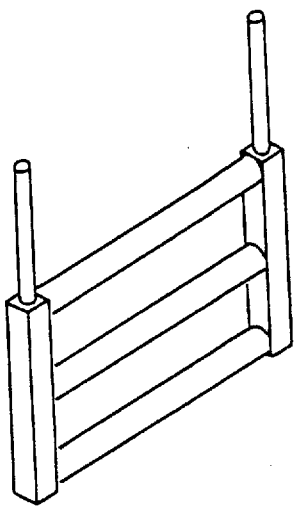

In the present embodiment, the plasma generating electrode 61 is comprised of a coil of one-turn. Other shapes, for example, a coil of two turns, as exemplified in FIG. 11A, or a coil of three or more turns, may be employed. FIG. 11B shows an example of a plasma generating electrode wherein a coil is whirled in a horizontal plane. FIGS. 11C and 11D illustrate a rectangular plane plasma generating electrodes, and a plane disk plasma generating electrode, respectively. Further, FIG. 12A is a linear rod electrode, FIG. 12B is an electrode of which three rod electrodes are arranged in parallel in a horizontal plane, and FIG. 12C is an electrode of which three rod electrodes are arranged in parallel in a vertical plane. Each of electrodes shown in FIGS. 11 and 12 have two terminals, one of which is connected to the radio frequency power and the other is grounded through a capacitor. Such two terminals are placed near both ends of the plasma generating electrode. The plasma generating electrode and the two terminals are cooled by circulating cooling water.

The electrode potential controlling system 80 will be explained with reference to FIG. 1. The electrode potential controlling system 80 is provided between the lead-in terminal 63 of the plasma generating electrode 61 and the processing chamber 20, and includes a capacitor (first capacitor) 81. When a switch 84 connects the lead in terminal 63 to the electrode potential controlling system 80, the one end of the plasma generating electrode 61 is not grounded in terms of direct current by the effect of this capacitor 81. In the present embodiment, the electrostatic capacitance of the capacitor 81 is approximately 500 pF. Any capacitance ranging from 100 pF to 10 μF is preferable. In contrast, the stray capacitance between the plasma generating electrode 61 and processing chamber 20 is around a few pF. An example of a suitable capacitor 81 is a ceramic capacitor exhibiting excellent radio frequency characteristics and withstanding voltage.

The processing chamber 20 may be selectively connected to an inner wall potential controlling system 85 or ground through a switch 87. The inner wall potential controlling system 85 includes a capacitor 86 (second capacitor) preferably having a capacitance ranging from 100 pF to 10 μF.

In FIG. 1, an electric circuit for generating plasma may be selected from the following three combinations: a first combination in which the switch 84 connects the electrode 61 to the electrode potential controlling system 80 and the switch 87 connects the chamber 20 to the inner wall potential controlling system 85; a second combination in which the switch 84 connects the electrode 61 to the electrode potential controlling system 80 and the switch 87 connects the chamber 20 to ground; and a third combination in which the switch 84 connects the electrode 61 to ground and the switch 87 connects the chamber 20 to the inner wall potential controlling system 85. In all three combinations, the relative potential between the plasma generating electrode 61 and the inner wall of the processing chamber can be varied by adjusting either or both capacitances of the capacitor 81 and/or the capacitor 86.

Figure 8:
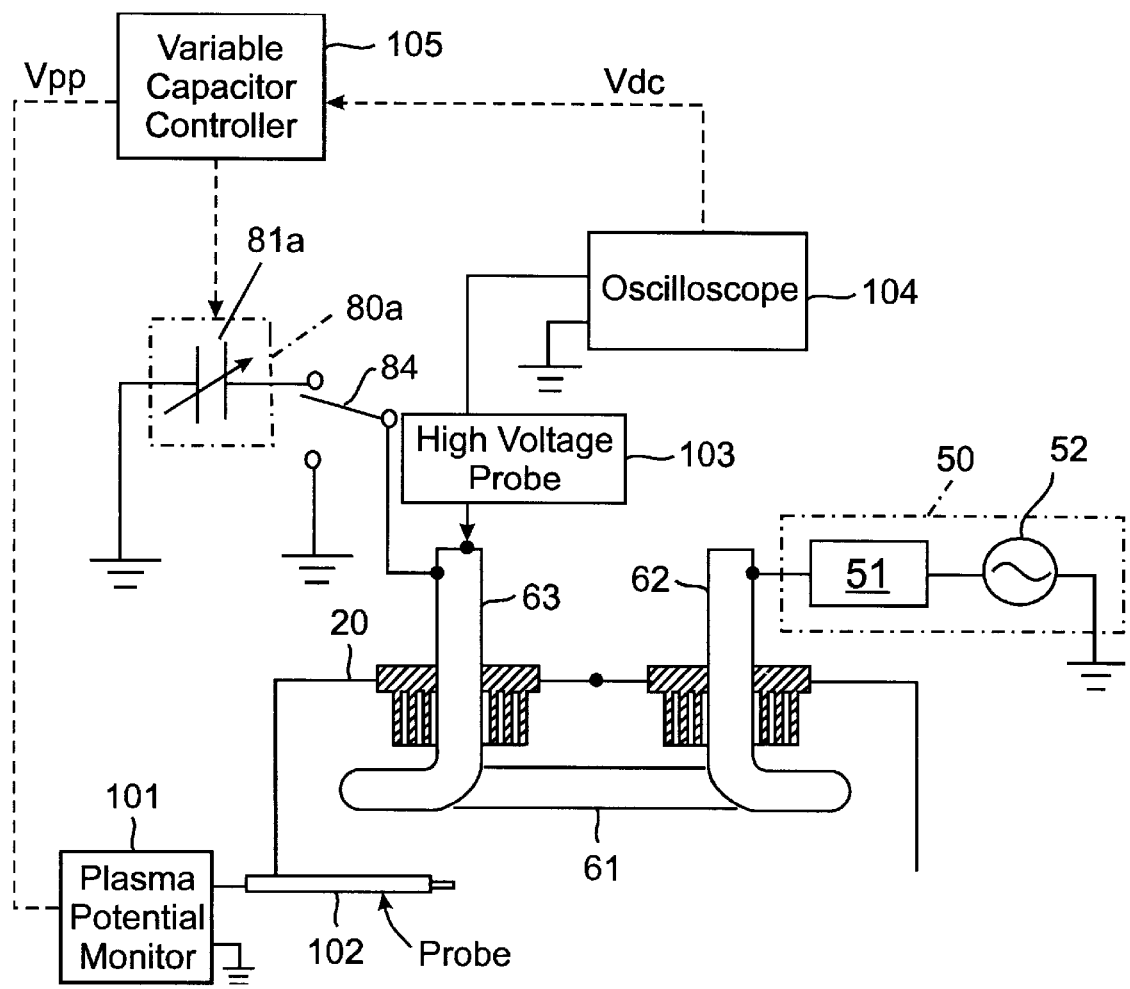
FIG. 8 is a block diagram illustrating another embodiment of the electrode potential controlling system.
Figure 9:
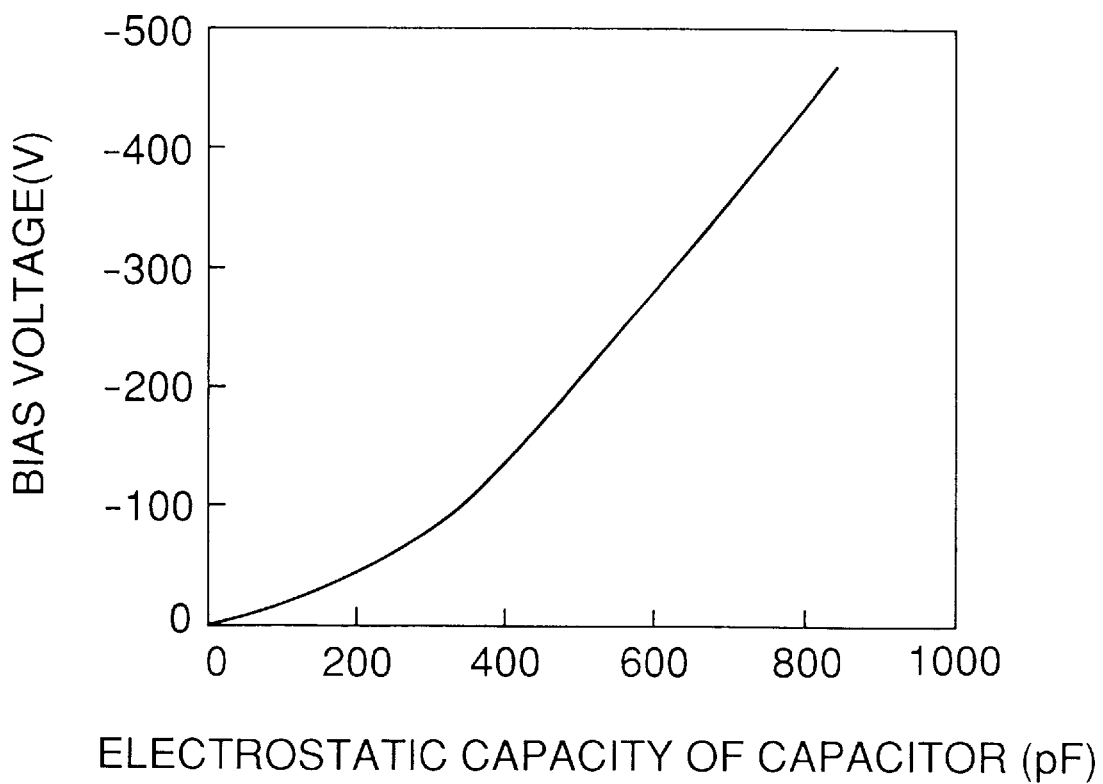
FIG. 9 is a graph illustrating the relationship between the electrostatic capacitance of the capacitor and the bias voltage induced to the plasma generating electrode.

FIG. 9 is a graph illustrating the relationship between the electrostatic capacitance of the capacitor 81 and the bias voltage induced to the plasma generating electrode 61. The graph demonstrates that the absolute value of the direct current bias voltage varies in response to the capacitance of the capacitor. Therefore, the direct current bias voltage of the plasma generating electrode can be set to an adequate value by changing the capacitance of the capacitor. When the plasma generating electrode is sputtered, such sputtering can be suppressed by decreasing the capacitance of the capacitor, since the absolute value of the direct current bias voltage is decreased. When a variable capacitor 81a is used as the electrode potential controlling system 80a, as shown in FIG. 8, the capacitance of the capacitor may be readily varied, and thus the direct current bias voltage of the plasma generating electrode may be readily controlled. In addition, by monitoring the direct current bias component of the plasma generating electrode in a batch plasma processing, the capacitance of the capacitor can be controlled so that the direct current component becomes constant, even if the plasma processing condition slightly varies for each batch processing.

As illustrated in FIG. 8, a high voltage probe 103 that is monitored by an oscilloscope 104 or a digital multimeter can be used to monitor the direct current bias component $V_{dc}$ of the plasma generating electrode 61. In addition, a plasma potential $V_{pp}$ is monitored by a plasma potential monitor 101 and connected probe 102. Signals representative of the plasma potential $V_{pp}$ and the DC bias voltage $V_{dc}$ are input into a variable capacitor controller 105, which includes a CPU for controlling the variable capacitor 81a. In order to suppress sputtering of the electrode 61, the plasma potential $V_{pp}$ is preferably kept below 50 volts and the DC bias voltage $V_{dc}$ is kept to a minimum using the variable capacitor controller 105.

In contrast, the sputtering effect set forth above can also be useful. For example, when a film is deposited on a substrate, the film is also deposited on the plasma generating electrode. In such a case, a capacitor capacitance can be found in which only the deposited film on the plasma generating electrode is sputtered, while the plasma generating electrode itself is not sputtered.

In addition, the apparatus shown in FIG. 1 can be used for a dry etching apparatus. In this case, byproducts formed during the etch process are deposited on the plasma generating electrode. Such film deposition can be reduced by sputtering only the film deposited on the plasma generating electrode by adjusting the capacitance of the capacitor 81a, shown in FIG. 8.

Figure 10:
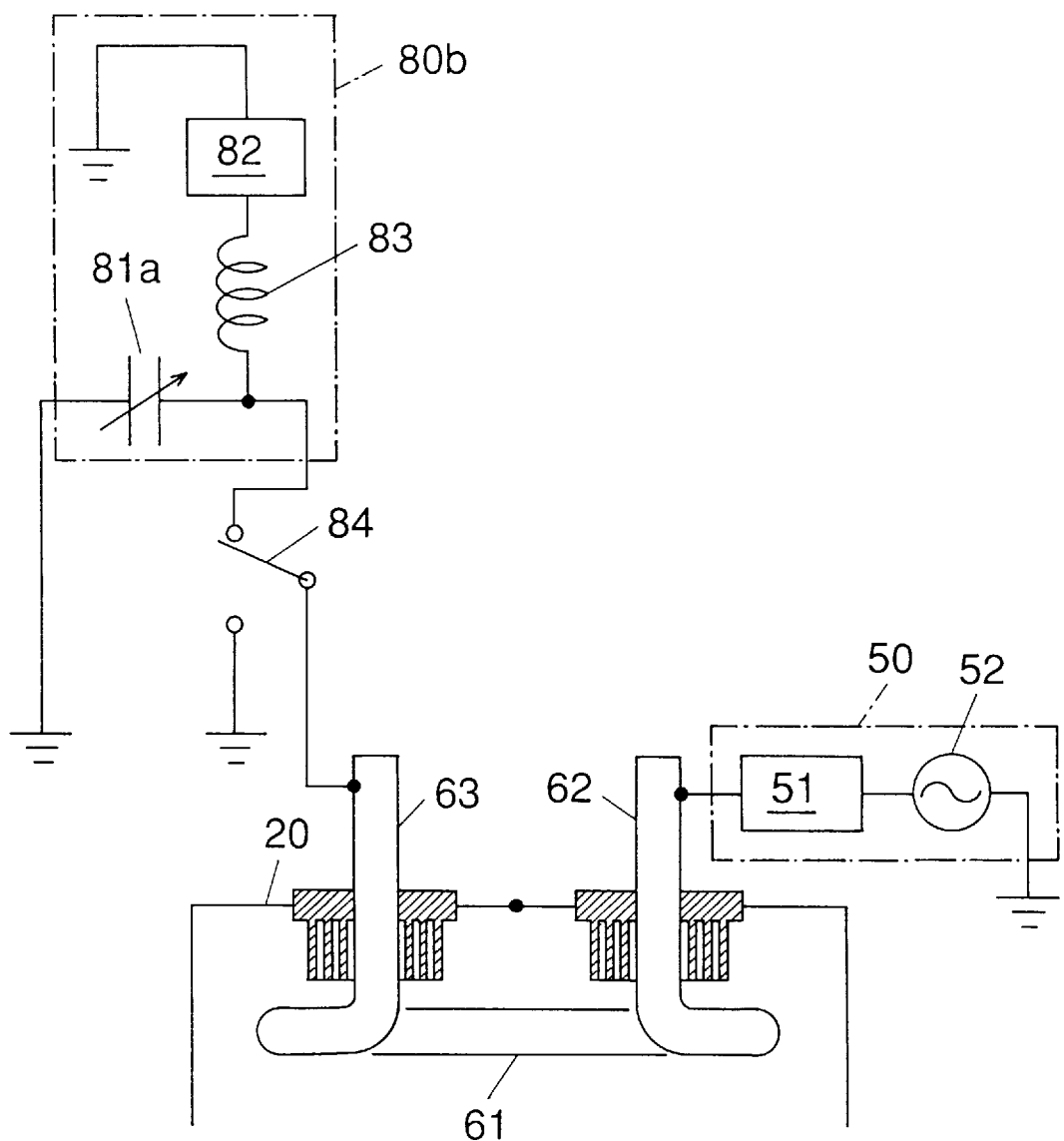
FIG. 10 is a block diagram illustrating a further embodiment of the electrode potential controlling system.

FIG. 10 is a further embodiment of the electrode potential controlling system. In the electrode potential controlling system 80b, direct current power 82 is branched between the lead-in terminal 63 of the plasma generating electrode 61 and the variable capacitor 81a through an inductor 83, in order to more effectively control the potential of the plasma generating electrode 61.

In FIG. 1, when the lead-in terminal 63, the plasma generating electrode 63, and the processing chamber 20 are grounded without being connected to the capacitors 81 and 86 so as to cause direct current to flow, the plasma in the processing chamber causes capacitively coupling discharge because the plasma spreads not only throughout the entire processing chamber 20 but also to the gas outlet system 30. As a result, the electron density in the plasma decreases. In contrast, when the lead-in terminal 63 of the plasma generating electrode 63 and/or the processing chamber 20 are grounded through the capacitors 81 and/or 86, the electron density in the plasma increases due to a localized plasma in the center of the processing chamber. For example, a plasma is generated in a gaseous argon atmosphere in the processing chamber under a pressure of 6 mtorr and an input power to the plasma generating electrode of 2 kW, the electron density of the plasma reaches $10^{11}$/cm$^3$.

In FIGS. 8 and 10, the variable capacitor 81a and a combination of the direct current power 82 and the inductor 83 are employed in the direct current potential controlling system 80 of the plasma generating electrode side. Such modifications are similarly applicable to the inner wall potential controlling system 85 of the processing chamber.

The following eight embodiments for depositing a thin film will be explained using the plasma enhanced CVD apparatus shown in FIG. 1, in which the switch 84 connects the electrode 61 to the electrode potential controlling system 80 and the switch 87 connects the chamber 20 to the ground.

The first embodiment includes titanium nitride film deposition. In FIGS. 1 and 2, titanium tetrachloride is used as a first source material in the source material container 1a, gaseous hydrogen as a second source material in the source material container 1b, and gaseous nitrogen as a third source material in the source material container 1c. The flow rates are 20 ml/min. for titanium tetrachloride, 200 ml/min. for gaseous hydrogen, and 20 ml/min. for gaseous nitrogen. The pressure in the processing chamber 20 is set to approximately 1 Pa and the temperature of the substrate 21 is held to 450° to 600° C. The power of the radio frequency power 52 is 3.0 kW, and the capacitance of the capacitor 81 is 500 pF. Under the condition set forth above, a film mainly containing titanium nitride and having a resistivity of 80 $\mu\Omega$·cm was deposited at a rate of 60 nm/min. Because no fluctuation of generated plasma or plasma generation was observed, unlike conventional apparatuses, the apparatus in accordance with the present invention is useful for the deposition of conductive thin films, such as titanium nitride. Further, metal film does not deposit on the surface of the plasma generating electrode.

Figure 6:
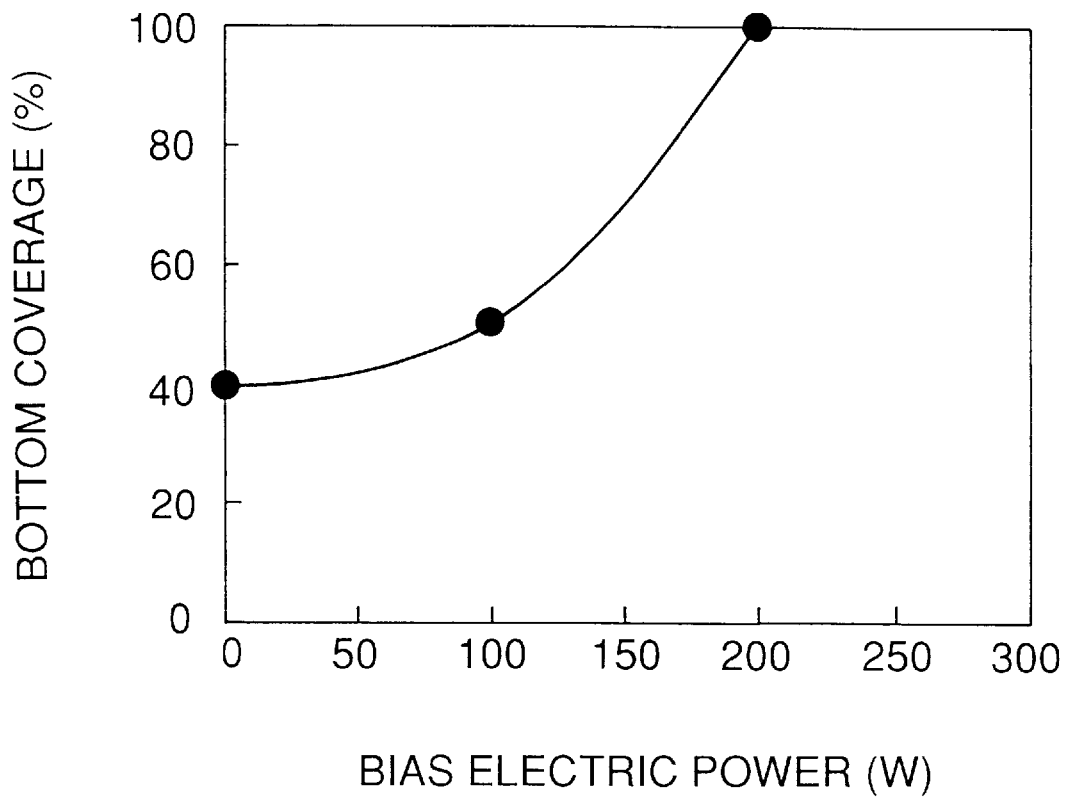
FIG. 6 is a graph illustrating the dependence of the bottom deposition rate on the power for base bias.

Such a titanium nitride film is used as barrier films at contact sections in semiconductor integrated circuits. In such a use, the film deposition must be carried out on the bottom of a hole having a diameter of around 0.35 $\mu$m and a depth of around 1.5 $\mu$m. FIG. 6 is a graph illustrating the dependence of the bottom deposition rate on the power for base bias, wherein the term "bottom deposition rate" is defined as follows:

Bottom coverage or deposition rate (%)=(b/a)×100 wherein "a" represents a thickness of the film at the flat section and "b" represents a thickness of the film deposited on the bottom of the contact hole. As shown in the graph of FIG. 6, the bottom deposition rate is drastically improved by raising the power for substrate bias. Such an improvement may be caused by the fact that the ions generated in the plasma enter perpendicular to the substrate 21 by the effect of the bias voltage of the substrate 21.

In the first embodiment set forth above, the plasma generating electrode 61 is comprised of titanium, which is one constituent of the deposited film, i.e., titanium nitride. Thus, if the plasma generating electrode is sputtered and the material comprising the electrode is included in the thin film, the material is not a contaminant of the deposited film.

When a multi-cusp magnetic field is formed near the inner wall of the processing chamber, a considerably homogeneous plasma is generated in the center at a distance of approximately 5 cm or more from the inner wall of the processing chamber. The formation of such a multi-cusp magnetic field is significantly effective to the homogeneity of the deposition on a large substrate, i.e., film thickness distribution, film composition distribution, and bottom deposition rate distribution. In particular, a homogeneous, high bottom deposition rate can be achieved by employing a substrate bias power source. The multi-cusp magnetic field enables a film thickness distribution within ±3% in a deposition process of a silicon nitride film onto a silicon wafer having a diameter of 6 inches.

In a second embodiment for film deposition, titanium tetrachloride, gaseous hydrogen, and gaseous argon are used for the first source material, second source material, and third source material, respectively. The flow rates are 20 ml/min. for titanium tetrachloride, 30 ml/min. for gaseous hydrogen, and 35 ml/min. for gaseous argon. The pressure in the processing chamber 20 is set to approximately 1 Pa, and the temperature of the substrate 21 is set to 550° to 600° C. The output of the radio frequency power 52 is 2.5 kW, and the capacitance of the capacitor 81 is 500 pF. When a film is deposited under such conditions, the film composition depends on the underlayer material used. For example, a titanium metal film is obtained from a silicon oxide underlayer, and titanium silicide (TiSi2) is obtained from a silicon underlayer. As described above, the apparatus in accordance with the present invention enables a stable semiconductor film deposition with a high reproducibility, since neither the fluctuation of the plasma with time, nor the absence of plasma generation are not observed, unlike the prior art. In addition, no deposition of the metal film was found on the plasma generating electrode, and the surface of the plasma generating electrode was not sputtered. The above-mentioned metallic titanium film and titanium silicide film are used as contact resistance reducing films at the contact sections in semiconductor integrated circuits, for example. When using the multi-cusp magnet and the substrate bias power source, a thin film having a high homogeneity and a high bottom deposition rate is obtainable.

When a metallic titanium film or titanium silicide film is deposited by a plasma enhanced CVD process in the prior art using low density plasma, a black film containing chlorine and having a high resistance is often obtained. In contrast, a film having a low resistance and a metallic gloss is obtainable from the apparatus in accordance with the present invention. The chlorine content in the film is 1% or less.

Further, the chlorine content can be reduced to 0.1% or less by applying a substrate bias during deposition. The drawbacks due to the fact that the titanium-based conductive film contains chlorine are as follows: (1) The film loses its metallic gloss; (2) the resistivity of the film decreases with the increased chlorine; (3) chlorine corrodes the wiring materials set forth above, and often causes breaking of wiring; and (4) the film characteristics are unstable due to the change with time affected by much chlorine. Such drawbacks can be solved by the plasma enhanced CVD in accordance with the present invention since the chlorine content in the titanium-based conductive film decreases.

When a metallic titanium pipe is used as the plasma generating electrode for depositing a metallic titanium film or a compound film containing titanium, a film containing no impurities and having excellent characteristics can be deposited because titanium deposited by the sputtering of the plasma generating electrode is not an impurity.

The third embodiment includes an example of the deposition of an amorphous silicon thin film. The source material containers 1a and 1c are not used and monosilane is used as a source material in the source material container 1b at a flow rate of 20 ml/min. The pressure in the processing chamber 20 is set to approximately 1 Pa, and the temperature of the substrate 21 is set to 150° to 300° C. The output of the radio frequency power is 0.5 kW, and the capacitance of the capacitor 81 is 500 pF. An amorphous silicon film can be deposited under the above-mentioned conditions. Also, neither fluctuation of the plasma with time, nor the absence of plasma generation, are found in this case. Further, a bias voltage is applied to the substrate, the hydrogen content in the film can be controlled with the bias power. Since the hydrogen content and hydrogen bonding state in the film are important to electrical characteristics of the amorphous silicon film, the present invention has an advantage in that such control can be achieved using the bias power.

The fourth embodiment includes an example of silicon oxide thin film deposition. The source material container 1a is not used, the source material container 1b contains monosilane, and the source material container 1c contains gaseous oxygen. The flow rates are 80 ml/min. for monosilane and 160 ml/min. for gaseous oxygen. The pressure in the processing chamber 20 is set to 1 Pa, and the temperature of the substrate 21 is 150° to 300° C. The output of the radio frequency power 52 is 2.5 kW and the capacitance of the capacitor 81 is 500 pF. A silicon oxide film is deposited under the above-mentioned conditions. Because a larger radio frequency window, which is used for external electrode-type apparatuses, is not required for the apparatus in accordance with the present invention, failure caused by such a window can be prevented. In this case, for example, by applying a bias power of 1.0 to 2.5 kW to the substrate, a silicon oxide film can be embedded onto fine gaps between various wiring films on the substrate. As explained above, the apparatus in accordance with the present invention is useful for the deposition of interlayer films between various wiring electrodes.

The gap embodiment characteristics of the wiring film in the deposition of the silicon oxide film will be explained in detail. A silicon wafer substrate having a diameter of 200 mm, on which a fine wiring pattern of an aluminum alloy is formed, is used. An insulation film is deposited so as not to leave voids between the wiring patterns in order to secure the insulation between the wiring patterns. When the silicon oxide deposition is attempted with a plasma enhanced CVD apparatus in accordance with the present invention without using the substrate bias applying system, a film is sometimes deposited in an overhang state near the ports of fine grooves of, for example 0.5 $\mu$m thick and 1 $\mu$m depth, between wiring patterns. Therefore, some voids are still left between the wiring patterns, occasionally, whereas no void is formed between the wiring patterns when using the substrate bias applying system.

As a result of the evaluation of the quality of the deposited silicon oxide film by infrared absorption spectroscopy, an O—H stretching absorption due to water and an O—H stretching absorption due to Si—OH are observed when not using the substrate bias applying system. In general, such impurities in the film cause a decrease in the reliability as the insulation film. In contrast, when using the substrate bias applying system, the impurity content is decreased to an extent that the above described absorbance is not observed. These observations demonstrate that the quality of the film can be improved by applying a bias power to the substrate.

The fifth embodiment in accordance with the present invention will be explained using the apparatus shown in FIG. 8, in which the switch 84 connects the electrode 61 to the electrode potential controlling system 80a. In FIGS. 8 and 2, the source material container 1a contains titanium tetrachloride as the first source material, the source material container 1b contains gaseous hydrogen as the second source material, and the source material container 1c contains gaseous nitrogen as the third source material. The flow rates are 20 ml/min. for titanium tetrachloride, 30 ml/min. for gaseous hydrogen, and 10 ml/min. for gaseous nitrogen. The pressure in the processing chamber 20 is set to approximately 1 Pa, and the temperature of the substrate 21 is set to 450° to 600° C. The output of the radio frequency power 52 is 2.5 kW and the capacitance of the variable capacitor 81a is varied within the range of 10 to 1500 pF. The capacitance of the capacitor is controlled so that the direct current bias voltage induced by the plasma generating electrode 61 is minus 250 V by monitoring it. Under the above-mentioned conditions, a film mainly containing titanium nitride is deposited at a rate of 30 nm/min. After 100 batch depositions, almost the same film can be deposited by a reproducible process.

The sixth embodiment will be explained using the apparatus shown in FIG. 10, in which the switch 84 connects the electrode 61 to the electrode potential controlling system 80b. The inlet gases, their flow rates, the substrate temperature, the output of the radio frequency power 52 are identical to those in the above-mentioned fifth embodiment, but the direct current power 82 is used as the electrode potential controlling system 80b in the present embodiment. The direct current bias voltage of the plasma generating electrode 61 is controlled so as to be maintained at minus 250 V using the direct current power 82, whereas the capacitance of the variable capacitor 81a is maintained at 500 pF. Under the above-mentioned conditions, a film mainly containing titanium nitride is deposited at a rate of approximately 30 nm/min., as in the fifth embodiment.

Figure 13:
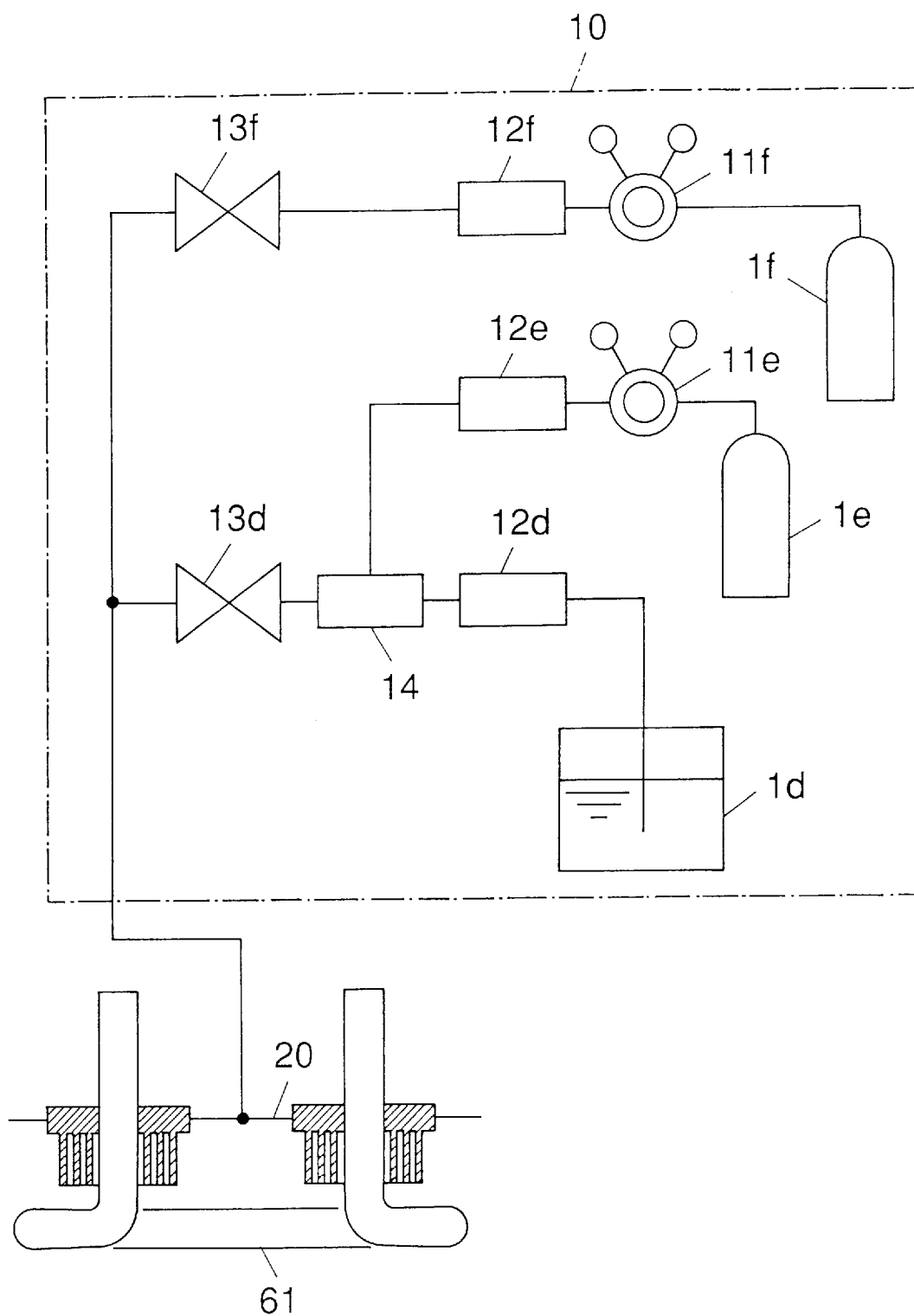
FIG. 13 is a block diagram illustrating another embodiment of the gas inlet system.

The seventh embodiment will be explained based on the apparatus shown in FIG. 1 using copper as the material of the plasma generating electrode 61, in which the switch connects the electrode 61 to the electrode potential controlling system and the switch 87 is grounded. A gas inlet system 10 shown in FIG. 13 is used. A source material container 1d contains a source material in a liquid state at a normal temperature and a normal pressure. The liquid source material is fed through a flow controller 12d into a vaporizer 14 to vaporize the liquid. Source material containers 1e and 1f are high pressure gas cylinders. The pressure of the source gases in the containers is reduced using reducing valves 11e and 11*f*, and their respective gas flows are controlled with flow controllers 12*e* and 12*f*. As a first source material in the source material container 1*d*, 10% bishexafluoroactylacetonatocopper(II) in 2-propanol (Cu (hfac)$_2$) solution is used at a flow rate of 0.6 g/min. As a second source material in the source material container 1*e*, gaseous hydrogen is used at a flow rate of 100 ml/min. and is mixed with the first source material in the vaporizer 14. The obtained gaseous mixture is introduced into the processing chamber 20 through a valve 13*d*. As a third source material in the source material container 1*f*, gaseous hydrogen is used again at a flow rate of 300 ml/min. and is introduced into the processing chamber 20 through a valve 13*f*. The pressure in the processing chamber 20 is set to approximately 3 Pa, and the temperature of the substrate 21 is set to 250° C. The output of the radio frequency 52 is 1.5 kW. A thin film mainly containing copper is deposited on a substrate at a rate of 20 nm/min. under the above-mentioned conditions. The obtained copper film can be used for wiring in semiconductor integrated circuits. Since copper is used as the plasma generating electrode in this embodiment, the plasma generating electrode material included in the film is not an impurity.

The eighth embodiment will explained using the apparatus shown in FIG. 1, in which the apparatus is used for dry etching. The switch 84 connects the electrode 61 to the electrode potential controlling system 80, and the switch 87 is grounded. The source material container 1*a* is not used in this embodiment. The source material containers 1*b* and 1*c* contain gaseous chlorine and boron trichloride (BCl$_3$), respectively. Their flow rates are both 50 ml/min. The pressure in the processing chamber 20 is set to approximately 10.3 Pa, and the temperature of the substrate 21 is set to 100° C. The output of the radio frequency power 52 is 2 kW, and the capacitance of the capacitor 81 is 300 pF. A silicon oxide film having a thickness of 1 μm is deposited on a silicon wafer having a diameter of 6 inches. After 1 μm of aluminum film is deposited thereon, the silicon wafer is patterned with a photoresist. The coating pattern of the photoresist is a line-and space pattern consisting of a coating width of 0.5 μm and a noncoating groove width of 0.5 μm. The aluminum exposed at the noncoating groove is dry-etched. Under the above-mentioned condition, the aluminum thin film can be etched at an etch rate of 100 nm/min. In this case, the film deposition on the plasma generating electrode and sputtering of the plasma generating electrode are not observed. The fluctuation of the plasma with time is not observed, so a stable and reproducible dry etch process can be achieved. In such a dry etch process, an anisotropic etch process can be achieved by applying a bias power to the substrate.

Next, some embodiments will be explained in which the switch 84 is grounded, and the switch 87 connects the chamber 20 to the inner wall potential controlling system 85 in FIG. 1. The inner wall potential controlling system 85 includes a serial circuit, as shown in FIG. 10, consisting of the direct current power 82 and the inductor 83, as well as the capacitor 86. The potential of the inner wall of the processing chamber is adjusted to 500 to 600 V with the inner wall potential controlling system 85, so that the difference between the high plasma potential generated by the plasma generating electrode 61 and the potential of the inner wall of the processing chamber does not increase to prevent abnormal discharge. Using such a basic circuit, the ninth to thirteenth embodiments are carried out as follows.

The ninth embodiment includes titanium nitride film deposition. In FIGS. 1 and 2, titanium tetrachloride is used as the first source material in the source material container 1*a*, gaseous hydrogen as the second source material in the source material container 1*b*, and gaseous nitrogen as the third source material in the source material container 1*c*. The flow rates are 20 ml/min. for titanium tetrachloride, 200 ml/min. for gaseous hydrogen, and 20 ml/min. for gaseous nitrogen. The pressure in the processing chamber 20 is set to approximately 1.3 Pa, and the temperature of the substrate 21 is set to 450° to 600° C. The output of the radio frequency power 52 is 3.0 kW, and a voltage of 300 V is applied to the processing chamber 20 using the inner wall potential controlling system 85. Under the above-mentioned conditions, a film mainly containing titanium nitride can be deposited at a rate of approximately 60 nm/min. Since unlike the prior art, neither fluctuation of the plasma with time, nor the absence of plasma generation, are observed, the apparatus in accordance with the present invention is useful in conductive film deposition, such as titanium nitride deposition. In addition, no metal film is deposited on the surface of the plasma generating electrode.

Figure 7:
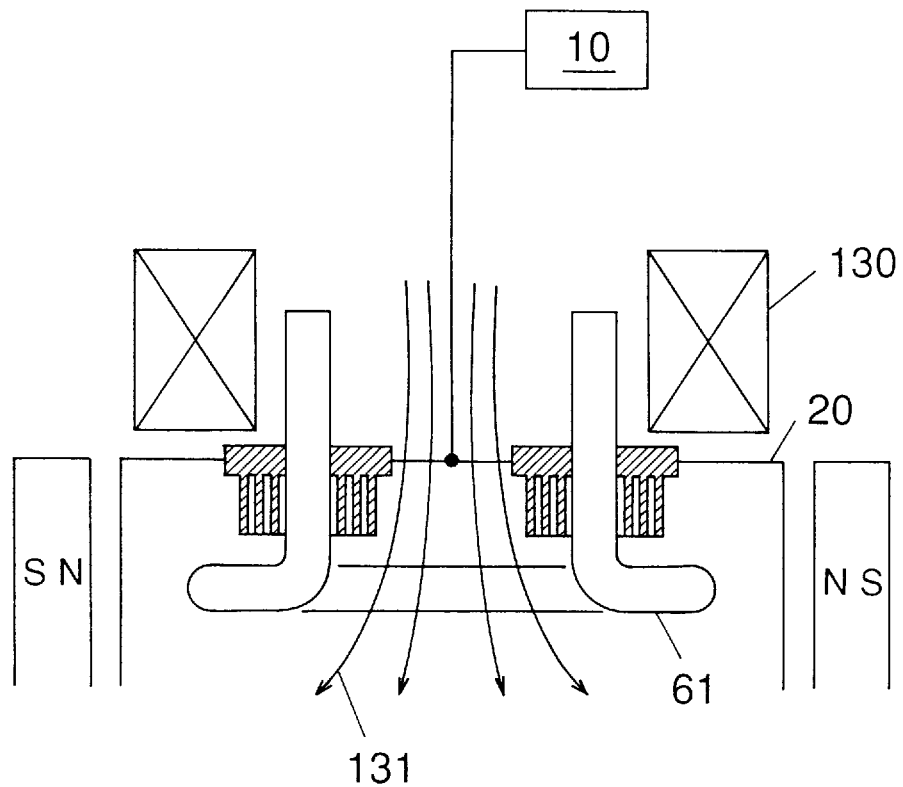
FIG. 7 is a block diagram illustrating a portion of another embodiment of a plasma enhanced CVD apparatus in accordance with the present invention.

FIG. 7 is a block diagram illustrating a main part of another embodiment of the plasma enhanced CVD apparatus in accordance with the present invention. This embodiment is identical to the embodiment shown in FIG. 1, except that a solenoid coil 130 is placed above the plasma generating electrode 61. The lines of magnetic force 131 generated by the solenoid coil 130 pass through near the center of the plasma generating electrode 61 having a coil shape of one-turn and diverge. The lines of magnetic force 131 generate a higher density plasma in the processing chamber 20. Further, the discharge readily starts in this embodiment. When like the above-mentioned ninth embodiment a film is deposited while applying a current flow of 45 A to the solenoid coil 130 using the apparatus in FIG. 7, the deposition rate of the titanium nitride film is 60 nm/min. and the thickness variance of the film on a 8-inch wafer is approximately ±5%. The variance is improved by around 5 points compared with a case not using the solenoid coil 130.

The tenth embodiment of the film deposition method will be explained. Titanium tetrachloride, gaseous hydrogen, and gaseous argon are used as the first, second and third source materials, respectively, at flow rates of 20 ml/min., 200 ml/min. and 35 ml/min., respectively. The pressure in the processing chamber 20 is set to approximately 1 Pa, and the temperature of the substrate 21 is set to 550° to 600° C. The output of the radio frequency power 52 is 2.5 kW. A voltage of 300 V is applied to the processing chamber using the inner wall potential controlling system 85. When a film is deposited under the above-mentioned conditions, the film composition varies with the underlayer material. For example, when the underlayer is a silicon oxide film, the obtained film is composed of metallic titanium, and when the underlayer material is silicon, the obtained film is composed of titanium silicide (TiSi$_2$)

The eleventh embodiment includes an example of amorphous silicon film deposition, in which only the source material container 1*b* containing monosilane is used. The flow rate of monosilane is 20 ml/min. The pressure of the processing chamber 20 is set to approximately 1 Pa, and the temperature of the substrate 21 is set to 150° to 300° C. The output of the radio frequency power 52 is 0.5 kW. A voltage of 200 V is applied to the processing chamber 20 using the inner wall potential controlling system 85. An amorphous silicon film can be deposited under such conditions.

The twelfth embodiment includes silicon oxide film deposition. Monosilane in the source material container 1*b* and gaseous oxygen in the source material container 1*c* are used, whereas the source material container 1*a* is not used. The flow rates are 80 ml/min. for monosilane, and 160 ml/min. for gaseous oxygen, respectively. The pressure in the processing chamber 20 is set to approximately 1 Pa, and the temperature of the substrate 21 is set to 150° to 300°0 C. The output of the radio frequency power is 2.5 kW. A voltage of 300 V is applied to the processing chamber 20 using the inner wall potential controlling system 85. A silicon oxide film can be deposited under such conditions.

The thirteenth embodiment will be explained. Titanium tetrachloride, gaseous hydrogen and gaseous nitrogen are used as the first source material in the source material container 1a, the second source material in the source material container 1b, and the third source material in the source material container 1c, respectively. Their flow rates are 20 ml/min. for titanium tetrachloride, 200 ml/min. for gaseous hydrogen, and 10 ml/min. for gaseous nitrogen. The pressure in the processing chamber 20 is set to approximately 1 Pa, and the temperature of the substrate 21 is set to 450° to 600° C. The output of the radio frequency power 52 is 2.5 kW. A voltage of 300 V is applied to the processing chamber 20 using the inner wall potential controlling system 85. A film mainly containing titanium oxide is deposited at a flow rate of approximately 30 ml/min. under such conditions.

The fourteenth embodiment will be explained, in which the switch 84 connects the electrode 61 to the electrode potential controlling system 80 and the switch 87 connects the chamber 20 to the inner wall potential controlling system 85 in FIG. 1. The inner wall potential controlling system 85 includes the series circuit consisting of the direct current power 82 and the inductor 83 shown in FIG. 10, as well as the capacitor 86.

In the fourteenth embodiment, the kinds of source gases, their flow rates, the substrate temperature, and the output of the radio frequency power 52 are identical to those in the thirteenth embodiment, except that a capacitor 81 having a capacitance of 500 pF is provided between the plasma generating electrode 61 and the ground. A film mainly containing titanium oxide is deposited at a rate of approximately 30 nm/min. under such conditions, like the above-mentioned thirteenth embodiment.

In the embodiments set forth above, the plasma generating electrode having a coil shape of one-turn shown in FIG. 3 is used. Further, plasma generating electrodes having various coil shapes, shown in FIGS. 11 and 12, can be also used as set forth above, depending on the plasma processing condition. In particular, the size and shape of the plasma generating electrode can be selected in consideration of the film thickness for plasma enhanced CVD or the etch rate for dry etching. For example, when using a plasma generating electrode of a coil of one-turn having a diameter of 140 mm in the above-mentioned ninth embodiment, the film thickness variance on the 8-inch wafer is approximately ±5% for the solenoid coil 130 in FIG. 7. When the pressure is changed to 0.5 Pa, the film thickness variance increases to ±8%. By changing the diameter of the plasma generating electrode from 140 mm to 160 mm, the variance returns to ±5% again. The film thickness variance can be improved by changing the plasma generating electrode in such a manner.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A plasma enhanced CVD process for depositing a conductive film on a substrate, comprising the steps of:

providing a processing chamber having a plasma generating electrode having two terminals, one of said terminals connected to a radio frequency power source and another of said terminals being grounded through an electrode potential controlling system, and an inner wall potential controlling system for grounding said processing chamber, introducing a source gas into the processing chamber, and generating plasma by supplying an electric power to the plasma generating electrode provided in the processing chamber.

2. A plasma enhanced CVD process for depositing a conductive film on a substrate, comprising the steps of:

providing a processing chamber having a plasma generating electrode having two terminals, one of said terminals connected to a radio frequency power source and another of said terminals being grounded through an electrode potential controlling system, and said processing chamber being grounded, introducing a source gas into the processing chamber, and generating plasma by supplying an electric power to the plasma generating electrode provided in the processing chamber.

3. A plasma enhanced CVD process for depositing a conductive film on a substrate, comprising the steps of:

providing a processing chamber having a plasma generating electrode having two terminals, one of said terminals connected to a radio frequency power source and another of said terminals being grounded, and an inner wall potential controlling system for grounding said processing chamber, introducing a source gas into the processing chamber, and generating plasma by supplying an electric power to the plasma generating electrode provided in the processing chamber.

4. A dry etch process for etching a film on a substrate comprising the steps of:

providing a processing chamber having a plasma generating electrode having two terminals, one of said terminals is connected to a radio frequency power source and another of said terminals being grounded through an electrode potential controlling system, and an inner wall potential controlling system for grounding said processing chamber, introducing a process gas into the processing chamber, and generating plasma by supplying an electric power to the plasma generating electrode provided in the processing chamber.

5. A dry etch process for etching a film on a substrate, comprising the steps of:

providing a processing chamber having a plasma generating electrode having two terminals, one of said terminals connected to a radio frequency power source and another of said terminals being grounded through an electrode potential controlling system, and said processing chamber being grounded, introducing a process gas into the processing chamber, and generating plasma by supplying an electric power to the plasma generating electrode provided in the processing chamber.

6. A dry etch process for etching a film on a substrate, comprising the steps of:

providing a processing chamber having a plasma generating electrode having two terminals, one of said terminals connected to a radio frequency power source and another of said terminals being grounded, and said processing chamber being grounded through an inner wall potential controlling system, introducing a process gas into the processing chamber, and generating plasma by supplying an electric power to the plasma generating electrode provided in the processing chamber.

7. An apparatus for processing a film on a substrate, comprising:

a processing chamber, a pumping system for evacuating the processing chamber, a gas inlet system for introducing a source gas into the processing chamber, a radio frequency power source, an electrode potential controlling system, a plasma generating electrode provided in the processing chamber, said plasma generating electrode has two terminals, one of the two terminals is connected to the radio frequency power source and other of the terminals is grounded through the electrode potential controlling system, and an inner wall potential controlling system for grounding said processing chamber.

8. The apparatus according to claim 7, wherein said electrode potential controlling system includes a first capacitor.

9. The apparatus according to claim 8, wherein the electrostatic capacitance of said first capacitor ranges from 100 pF to 10 $\mu$F.

10. The apparatus according to claim 8, wherein said first capacitor is a variable capacitor.

11. The apparatus according to claim 7, wherein said electrode potential controlling system includes a first capacitor connected between said other terminal and ground, and a series circuit including an inductor and a direct current power source connected between a ground and a connection point between said other terminal and said first capacitor.

12. The apparatus according to claim 7, wherein said inner wall potential controlling system includes a second capacitor.

13. The apparatus according to claim 7, wherein a surface of said plasma generating electrode is a conductor.

14. The apparatus according to claim 7, wherein said plasma generating electrode is a coil of substantially one-turn.

15. The apparatus according to claim 7, wherein said plasma generating electrode is a coil of more than one-turn.

16. The apparatus according to claim 7, wherein said plasma generating electrode is a coil extending in a horizontal plane.

17. The apparatus according to claim 7, wherein said plasma generating electrode is a linear rod.

18. The apparatus according to claim 7, wherein said plasma generating electrode is an electrode in which two rods are arranged in parallel.

19. The apparatus according to claim 7, wherein said plasma generating electrode is a flat plate.

20. The apparatus according to claim 7, wherein an inside of said plasma generating electrode is cooled with a fluid.

21. The apparatus according to claim 7, wherein a material comprising said plasma generating electrode is identical to a material of a film to be deposited on the substrate.

22. The apparatus according to claim 7, wherein a material comprising said plasma generating electrode is a part of a composition of a film to be deposited on the substrate.

23. The apparatus according to claim 7, wherein said apparatus further comprises a multi-cusp magnetic field generating system which can generate a multi-cusp magnetic field inside said processing chamber.

24. The apparatus according to claim 7, wherein said pumping system is provided with a pressure controlling system for maintaining a constant pressure in said processing chamber.

25. The apparatus according to claim 7, wherein said plasma enhanced CVD apparatus further comprises a bias applying system for applying a bias voltage to said substrate.

26. The apparatus according to claim 7, wherein the apparatus is a plasma enhanced CVD apparatus for depositing a film on a substrate.

27. The apparatus according to claim 7, wherein the apparatus is a dry etching apparatus for etching a film on a substrate.

28. An apparatus for processing a film on a substrate, comprising:

a processing chamber, a pumping system for evacuating the processing chamber, a gas inlet system for introducing a source gas into the processing chamber, a radio frequency power source, an electrode potential controlling system, a plasma generating electrode provided in the processing chamber, said plasma generating electrode has two terminals, one of said terminals is connected to the radio frequency power source and another of said terminals being grounded through the electrode potential controlling system, and said processing chamber is grounded.

29. The apparatus according to claim 28, wherein said electrode potential controlling system includes a first capacitor.

30. The apparatus according to claim 28, wherein said electrode potential controlling system includes a first capacitor connected between said other terminal and the ground, and a series circuit including an inductor and a direct current power source connected between the ground and a connection point between said other terminal and said first capacitor.

31. The apparatus according to claim 28, wherein the apparatus is a plasma enhanced CVD apparatus for depositing a film on a substrate.

32. The apparatus according to claim 28, wherein the apparatus is a dry etching apparatus for etching a film on a substrate.

33. An apparatus for processing a film on a substrate, comprising:

a processing chamber, a pumping system for evacuating the processing chamber, a gas inlet system for introducing a source gas into the processing chamber, a radio frequency power source, a plasma generating electrode provided in the processing chamber, said plasma generating electrode has two terminals, one of said terminals is connected to the radio frequency power source and another of said terminals being grounded, and an inner wall potential controlling system for grounding the processing chamber.

34. The apparatus according to claim 8, wherein said inner wall potential controlling system includes a second capacitor.

35. The apparatus according to claim 33, wherein the apparatus is a plasma enhanced CVD apparatus for depositing a film on a substrate.

36. The apparatus according to claim 33, wherein the apparatus is a dry etching apparatus for etching a film on a substrate.

* * * * *